United States Patent [19]

Ronsisvalle

[11] Patent Number: 5,798,287

[45] Date of Patent: Aug. 25, 1998

[54] METHOD FOR FORMING A POWER MOS DEVICE CHIP

[75] Inventor: Cesare Ronsisvalle, Catania, Italy

[73] Assignee: Consorzio per la Ricerca sulla Microelettronica nel Mezzogiorno, Catania, Italy

[21] Appl. No.: 861,496

[22] Filed: May 22, 1997

Related U.S. Application Data

[63] Continuation of Ser. No. 487,838, Jun. 7, 1995, abandoned, and a division of Ser. No. 360,596, Dec. 21, 1994, abandoned.

[30] Foreign Application Priority Data

Dec. 24, 1993 [EP] European Pat. Off. .............. 93830523

[51] Int. Cl.$^6$ .................................................. H01L 21/332
[52] U.S. Cl. ................. 438/133; 438/106; 438/137; 438/140
[58] Field of Search ......................... 438/106, 133, 438/135, 137, 140; 148/DIG. 126

[56] References Cited

U.S. PATENT DOCUMENTS

| | | | |
|---|---|---|---|
| 3,434,019 | 3/1969 | Carley | 317/235 |
| 3,667,008 | 5/1972 | Katnack | 317/235 |
| 3,831,067 | 8/1974 | Wislocky et al. | 317/234 |
| 4,008,486 | 2/1977 | Byczkowski | 357/74 |
| 4,015,278 | 3/1977 | Fukuta | 357/22 |
| 4,017,886 | 4/1977 | Tomono et al. | 357/54 |
| 4,055,884 | 11/1977 | Jambotkar | 29/571 |
| 4,070,690 | 1/1978 | Wickstrom | 357/68 |
| 4,145,700 | 3/1979 | Jambotkar | 357/23 |
| 4,236,171 | 11/1980 | Shen | 357/68 |
| 4,305,087 | 12/1981 | Wislocky | 357/79 |
| 4,329,642 | 5/1982 | Luthi et al. | 324/158 |
| 4,376,286 | 3/1983 | Lidow et al. | 357/23 |
| 4,399,449 | 8/1983 | Herman et al. | 357/53 |
| 4,412,242 | 10/1983 | Herman et al. | 357/52 |
| 4,414,560 | 11/1983 | Lidow | 357/39 |
| 4,556,896 | 12/1985 | Meddles | 357/70 |
| 4,574,208 | 3/1986 | Lade | 257/365 |
| 4,593,302 | 6/1986 | Lidow et al. | 357/23.4 |
| 4,606,998 | 8/1986 | Clodgo et al. | 430/313 |

(List continued on next page.)

FOREIGN PATENT DOCUMENTS

| | | | |
|---|---|---|---|
| 1136291 | 11/1982 | Canada | H01L 29/94 |
| A-0450320 | 10/1991 | European Pat. Off. | H01L 21/60 |
| 5-167070 | 2/1993 | Japan. | |
| 1224335 | 3/1971 | United Kingdom | H01L 11/14 |
| 2 087 648 | 5/1982 | United Kingdom | H01L 23/00 |

OTHER PUBLICATIONS

European Search Report from European Patent Application No. 93830524.0, filed Dec. 24, 1993.
Patent Abstracts of Japan, vol. 17, No. 570 (E-1448) Oct. 1993 & JP-A-05167070 NEC Kansai Ltd.

*Primary Examiner*—Tuan H. Nguyen
*Attorney, Agent, or Firm*—Wolf, Greenfield & Sacks, P.C.

[57] ABSTRACT

A power MOS chip and package assembly is provided for packaging a power MOS chip that has high heat dissipation. The assembly maintains a low contact resistance to the chip using compression without damaging the chip. The package assembly includes a thermally conductive body, a chip, an electrically conductive contact washer and an external electrical terminal. The chip includes a semiconductor substrate layer, an insulating layer, a conductive material gate layer and a metal layer. The layers form a plurality of first regions that are functionally inactive and a plurality of second regions. The insulating layer is formed to be thicker in the first regions than in the second regions so that the metal layer is elevated with respect to the substrate layer by a greater amount in the first regions than in the second regions. The contact washer is placed in mechanical contact with the chip so that it exerts pressure against the metal layer in the first regions to create an electrical connection. The terminal is placed in mechanical and electrical contact with the contact washer.

33 Claims, 2 Drawing Sheets

U.S. PATENT DOCUMENTS

| | | | |
|---|---|---|---|
| 4,638,553 | 1/1987 | Nilarp | 29/580 |
| 4,639,762 | 1/1987 | Neilson et al. | 257/341 |
| 4,641,418 | 2/1987 | Meddles | 29/588 |
| 4,642,419 | 2/1987 | Meddles | 174/52 |
| 4,651,181 | 3/1987 | David | 257/341 |
| 4,663,820 | 5/1987 | Ionescu | 29/590 |
| 4,680,853 | 7/1987 | Lodow et al. | 29/571 |
| 4,723,197 | 2/1988 | Takiar et al. | 361/403 |
| 4,789,882 | 12/1988 | Lidow | 357/23.4 |
| 4,794,431 | 12/1988 | Park | 357/19 |
| 4,845,545 | 7/1989 | Abramowitz et al. | 357/74 |
| 4,853,762 | 8/1989 | Ewer et al. | 357/79 |
| 4,878,099 | 10/1989 | Nilarp | 357/71 |
| 4,881,106 | 11/1989 | Barron | 357/23.8 |
| 4,890,142 | 12/1989 | Tonnel et al. | 257/786 |
| 4,965,173 | 10/1990 | Gould | 430/317 |
| 5,016,066 | 5/1991 | Takahashi | 257/341 |
| 5,030,581 | 7/1991 | Yakushiji et al. | 437/6 |
| 5,047,833 | 9/1991 | Gould | 357/71 |
| 5,130,767 | 7/1992 | Lidow et al. | 357/23.4 |
| 5,153,507 | 10/1992 | Fong et al. | 257/786 |
| 5,250,821 | 10/1993 | Ferla et al. | 257/723 |
| 5,365,112 | 11/1994 | Ohshima | 257/786 |
| 5,592,026 | 1/1997 | Frisina et al. | 257/786 |
| 5,610,439 | 3/1997 | Hivoshi et al. | 257/688 |

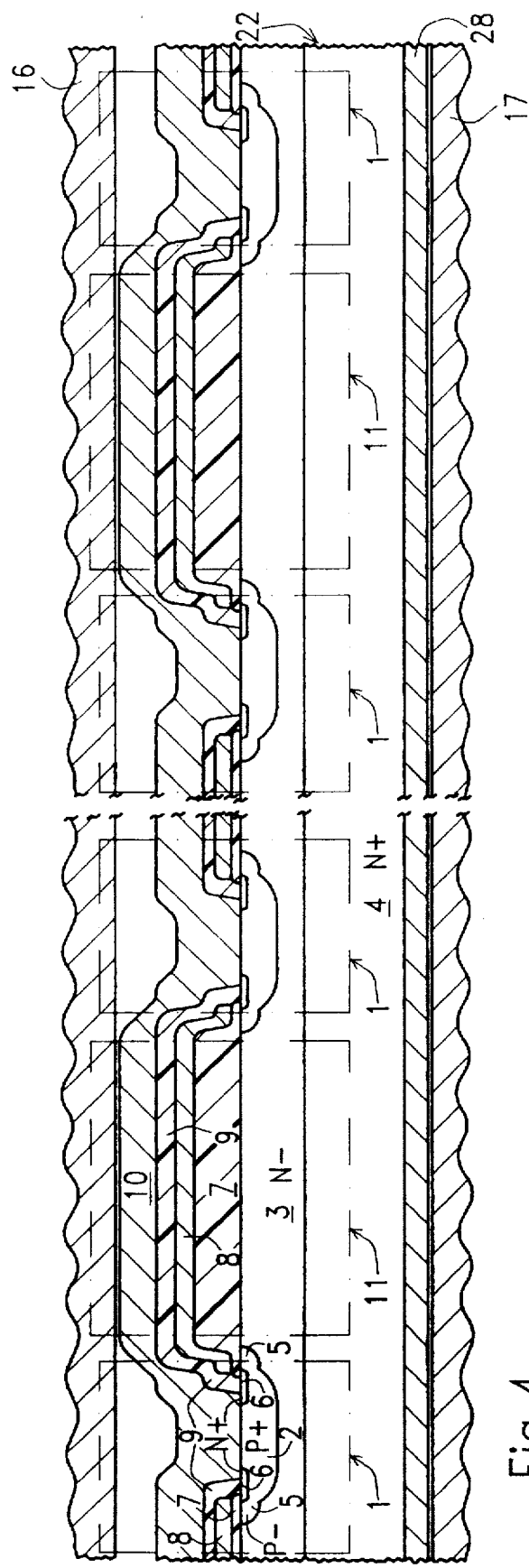
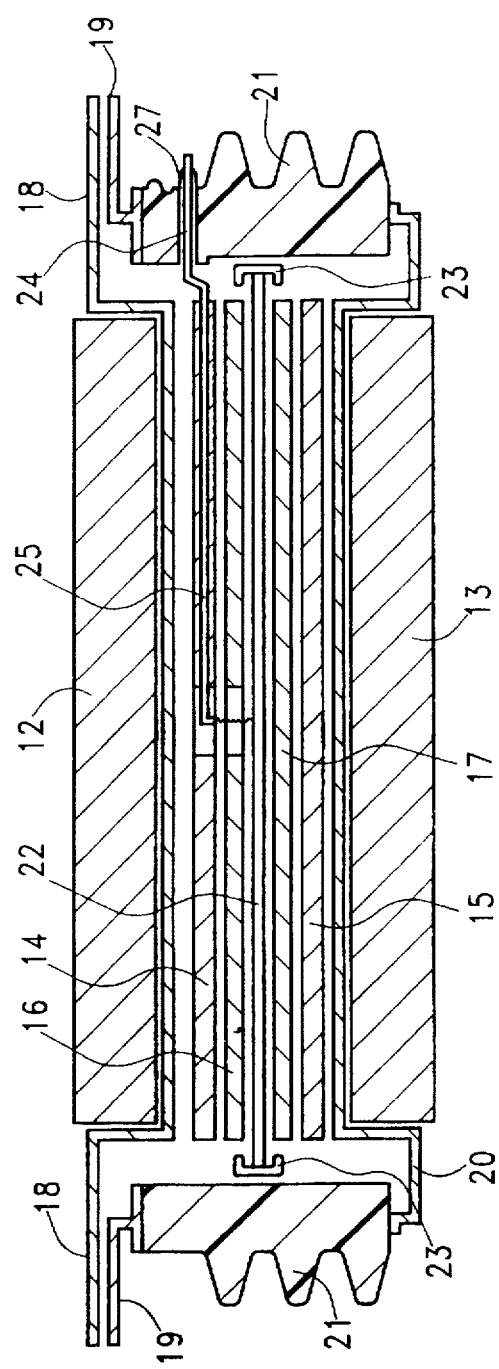
Fig. 4
Fig. 2

1

METHOD FOR FORMING A POWER MOS DEVICE CHIP

This application is a continuation of application Ser. No. 08/487,838, filed Jun. 7, 1995, now abandoned and a division of Ser. No. 360,596, filed Dec. 21, 1994 now abandoned.

BACKGROUND OF THE INVENTION

1. Field of the Invention

The present invention relates to a power MOS device chip and package assembly.

2. Discussion of the Related Art

Power semiconductor devices having a large chip size, i.e., those with a chip diameter larger than 2 or 3 cm, are generally packaged in ceramic packages, such as the so-called "press-pack" package, which provide a higher heat dissipation capability relative to plastic packages.

Due to the high power managed by the semiconductor device, the contact area between the device chip and the external leads (normally formed from nickel-plated copper) must be as large as possible; this makes it impractical to use wire bonding techniques commonly used for power devices with lower power ratings packaged in plastic or metallic packages. Therefore, the leads are electrically connected to the chip by means of molybdenum or tungsten plates where one side of a plate is in physical contact with the leads, while the other side is in electrical contact with the chip through thin washers or discs made from silver or silver-plated copper. Good electrical contact, which reduces the contact resistance, is achieved by maintaining high contact pressure between the leads, the plates, the washers or the discs and the chip.

This technique is used with semiconductor devices such as diodes, silicon controlled rectifiers (SCRs), gate turn-off thyristors (GTOs), triacs and so on, but it presents some problems when applied to MOS power devices (power MOSFETs, IGBTs, MCTs, etc.). MOS power devices are characterized by having fragile oxide and polysilicon layers at their surface, which can be damaged by the high contact pressures required to achieve good electrical contact. However, it is expected that power MOS devices will replace the more common thyristors even in the high-power field.

In view of the state of the art as described, an object of the present invention is to produce a power MOS device chip and package assembly that is not affected by the above-mentioned drawbacks, while assuring good heat dissipation characteristics and low contact resistance.

SUMMARY OF THE INVENTION

According to one embodiment of the present invention, this and other objects are attained by means of a power MOS device chip and package assembly, the package comprising a thermally conductive body, a chip, an electrically conductive washer and an external terminal. The chip is positioned in the body and includes a semiconductor substrate layer, an insulating layer, a conductive material gate layer and a metal layer. The insulating layer overlies the semiconductor substrate layer. The conductive material gate layer is insulated from the semiconductor substrate layer by the insulating layer. The metal layer is above the gate layer. The layers form a plurality of first regions that are functionally inactive and a plurality of second regions. The insulating layer is thicker in the first regions than in the second regions so that the metal layer is elevated with respect to the substrate layer by a greater amount in the first regions than in the second regions. The contact washer is positioned in the body in mechanical contact with the chip so that it exerts pressure against the metal layer in the first regions. The terminal is positioned in the body in mechanical contact with the contact washer.

According to this embodiment of the present invention, power MOS devices can be packaged using the same techniques used for traditional power semiconductor devices which are not affected by similar problems related to fragile surface structures.

The features of the present invention will be made more evident by the following detailed description of one embodiment, illustrated as a non-limiting example in the annexed drawings, wherein:

BRIEF DESCRIPTION OF THE DRAWINGS

FIG. 2 is a cross-sectional view of the assembly of FIG. 1;

FIG. 4 is a cross-sectional view taken along section line IV—IV of FIG. 3.

DETAILED DESCRIPTION

Figure 1:
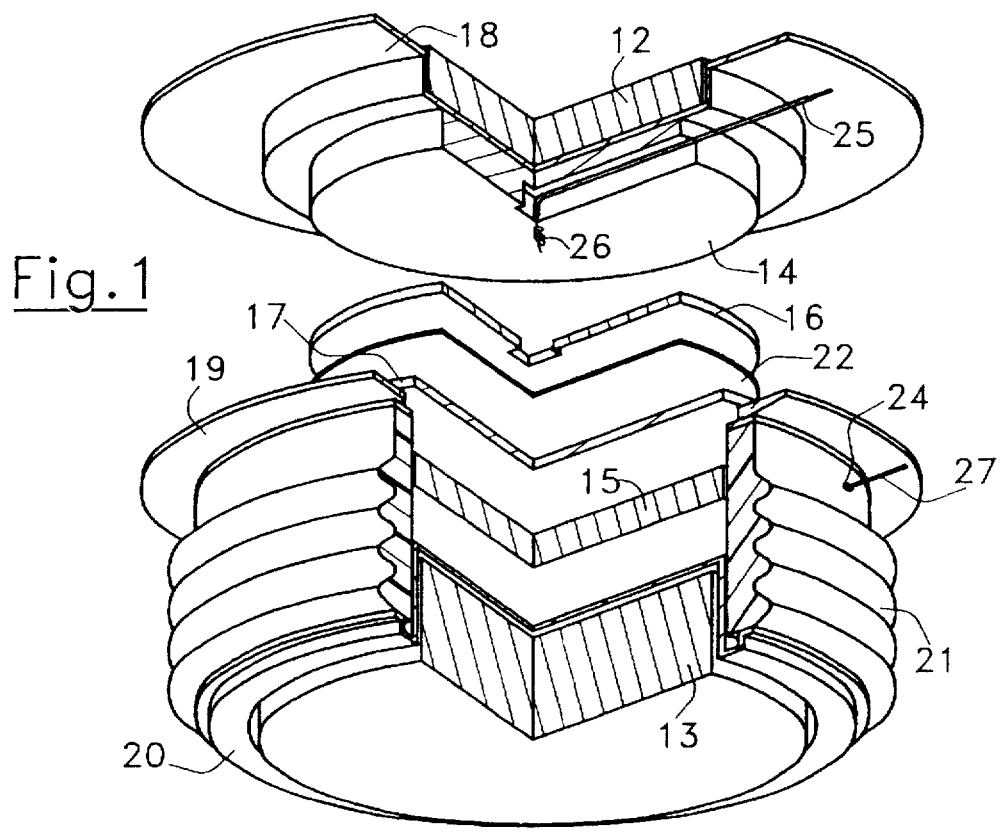
FIG. 1 is an exploded perspective view of a power MOS device chip and package assembly according to the invention.

A so-called "press-pack" ceramic package, shown in FIGS. 1 and 2 and described for example in the European Patent Application No. 91830215.9 filed on May 23, 1991, for a power semiconductor device chip 22 comprises a first pair of plates 12 and 13 of nickel-plated copper, constituting two external electrodes of the power device packaged therein, a second pair of plates 14 and 15 of molybdenum, a contact washer 16 of silver-plated copper or silver or molybdenum, a contact disc 17 also of silver-plated copper or silver or molybdenum, an upper flange 18, an intermediate flange 19 and a lower flange 20 all of nickel-plated copper, and a ceramic body 21. The power device chip 22 is interposed between the contact washer 16 and the contact disc 17, and is maintained in position by a plastic washer 23 as shown in FIG. 2. The ceramic body 21 is provided with a passing-through hole 24 for a metallic wire 25 that supplies a control signal to the power device. The metallic wire 25 terminates with a spring-shaped end 26; the passing-through hole 24 is externally connected to a terminal 27.

Figure 3:
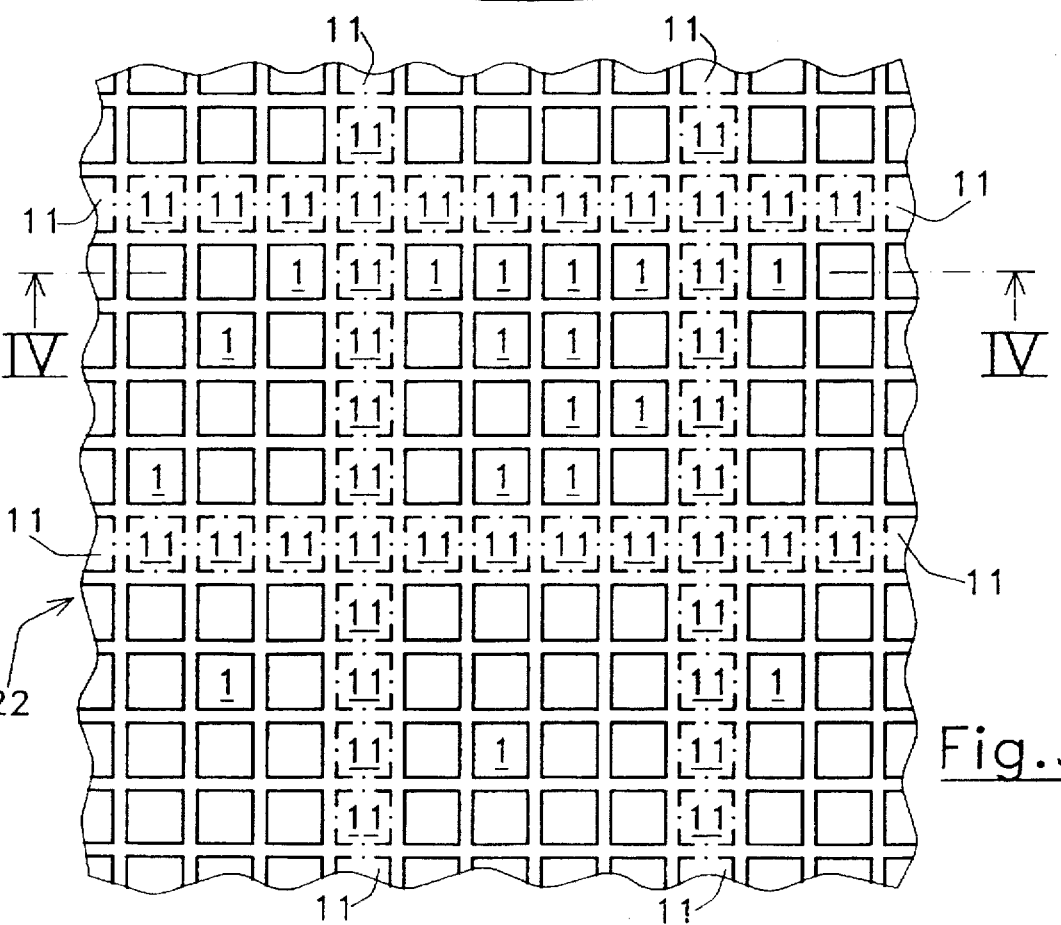
FIG. 3 is a schematic top plan view of a portion of the power MOS device chip of FIG. 1.

As illustrated by the embodiment in FIG. 3, a power MOS device, for example a power MOSFET, is comprised of a plurality of functionally active elementary cells 1, also called "source cells", formed in a manner known in the art and disposed to form a bidimensional array. As shown in FIG. 4, the chip 22 comprised of an N+ semiconductor substrate 4 over which an N− epitaxial layer 3 is grown. Each source cell 1 represents a functionally active unit of the whole power MOSFET, and proportionally contributes to the overall power MOSFET current capability. Each source cell 1 is comprised of a P+ deep body region 2 formed into the N− epitaxial layer 3. The P+ deep body region 2 is laterally surrounded by and merged with a P− annular region 5 constituting a channel region of the source cell 1; inside the P type semiconductor region that is composed by the P− annular region 5 and by the P+ deep body region 2, an N+ annular region 6 is formed to create a source region of the elementary source cell 1. At a top surface of the N– epitaxial layer 3, an oxide layer 7 having a typical thickness of approximately 0.85 µm extends over the P– annular region 5 and partially over the N+ annular region 6 and constitutes a gate oxide layer of the source cell 1. A polysilicon layer 8 is superimposed over and autoaligned with the underlying oxide layer 7, and constitutes a polysilicon gate layer of the source cell 1. An insulating layer 9 covers the polysilicon layer 8 and is selectively etched to form contact areas that allow an overlying metal layer 10 to contact both the N+ annular region 6 and the P+ deep body region 2. The metal layer 10 contacts each of the elementary source cells 1 in a similar manner forming a source electrode for the power MOSFET. A bottom surface of the N+ substrate 4 is covered by a metal layer 28 forming a drain electrode for the power MOSFET. A contact area for the polysilicon gate layer 8 is also provided at the top surface of the chip 22, even if not shown in the drawings, to allow the spring-shaped end 26 of the wire 25 to electrically contact the polysilicon gate layer 8 when the chip 22 is packaged in the "press-pack" package described above.

According to an embodiment of the present invention, the bidimensional array of source cells 1 includes dummy cells 11, which are functionally inactive and do not contribute to the overall current capability of the power MOSFET.

As illustrated by the embodiment in FIG. 3, the dummy cells 11 are disposed to form a grid with lines of dummy cells 11 regularly spaced in each of the horizontal dimensions by an equal number of source cells 1. The dummy cells 11 have horizontal dimensions substantially identical to those of the source cells 1, and vertical dimensions different from the source cells 1 as illustrated in FIG. 4.

As distinguished from the elementary source cells 1, the dummy cells 11 have no P+ deep body region 2, P– annular region 5 and N+ annular region 6. Furthermore, the thickness of the oxide layer 7 in the dummy cells 11, approximately 2 µm, is greater than the thickness of the oxide layer 7 in the source cells 1. This results in the surface of the metal layer 10 being elevated higher over the dummy cells 11 than over the source cells 1.

When the chip 22 is to be packaged into the press-pack package described above, the chip 22 is inserted into the ceramic body 21 so that the metal layer 28 contacts the contact disc 17, which in turn contacts the molybdenum plate 15. The bottom of the body 21 is sealed by the lower flange 20 and by the nickel-plated copper plate 13. The contact washer 16 is then positioned over the top surface of the chip 22, i.e. over the metal layer 10. The top of the body 21 is sealed by the molybdenum plate 14 and by the upper flange 18. To achieve good electrical contact, the nickel-plated copper plate 12 is pressed down to place the washer 16 into mechanical contact with the top surface of the chip 22.

Since the metal layer 10 is elevated higher over the dummy cells 11 relative to the source cells 1, the contact washer 16 contacts the dummy cells 11 instead of the source cells 1; the contact pressure is thus entirely distributed among the dummy cells 11 which, because of the greater thickness of the oxide layer 7, can withstand greater mechanical stresses as compared to the source cells 1. It is thus possible to obtain a good electrical contact without damaging the power MOSFET.

Various topological distributions of dummy cells 11 and elementary source cells 1 can be utilized depending on the required contact pressure, i.e., contact resistance.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of forming a power MOS device, the method comprising steps of:

A. fabricating a chip on a semiconductor substrate including a plurality of first regions and a plurality of second regions, the first regions being functionally inactive regions and thicker than the second regions;

B. placing the chip in a device package with the plurality of first regions and the plurality of second regions adjacent a conductive washer that contacts the plurality of first regions; and C. sealing the package to establish an electrical connection between the chip and an external electrical terminal.

2. The method as recited in claim 1, wherein step C includes applying sufficient pressure so that the conductive washer contacts the plurality of first regions without contacting the plurality of second regions.

3. The method as recited in claim 1, wherein step A includes, in the plurality of first regions and the plurality of second regions, fabricating an insulating layer on the semiconductor substrate, a gate layer above the insulating layer, and a metal layer above the gate layer.

4. The method as recited in claim 3, wherein the step of fabricating the insulating layer includes forming the insulating layer so that it is thicker in the plurality of first regions than in the plurality of second regions.

5. The method as recited in claim 1, wherein step A includes fabricating the plurality of second regions as functionally active elementary cells.

6. The method as recited in claim 5, wherein step A further includes dispersing the first regions among the second regions.

7. The method as recited in claim 5, wherein step A further includes fabricating an insulating layer on the semiconductor substrate, a gate layer above the insulating layer, and a metal layer above the gate layer.

8. The method as recited in claim 7, wherein the step of fabricating the insulating layer includes forming the insulating layer to be thicker in the plurality of first regions than in the plurality of second regions.

9. The method as recited in claim 1, wherein step C includes pressing the conductive washer against the plurality of first regions of the chip to create a contact pressure between the conductive washer and the chip that is distributed among only the plurality of first regions.

10. The method as recited in claim 9, wherein step A includes fabricating the plurality of second regions as functionally active elementary cells.

11. The method as recited in claim 1, wherein step A includes arranging the plurality of first regions in a grid.

12. The method as recited in claims 11, wherein step A further includes arranging the plurality of second regions in a plurality of groups that are separated by the grid of first regions.

13. The method as recited in claim 1, wherein step B includes placing the plurality of first regions adjacent a flat conductive contact washer.

14. A method of fabricating a chip, comprising the steps of:

A. fabricating a semiconductor substrate having a plurality of first regions and a plurality of second regions;

B. forming an insulating layer on the substrate so that first portions of the insulating layer overlying the plurality of first regions are thicker than second portions of the insulating layer overlying the plurality of second regions; and C. forming a metal layer above the insulating layer so that first portions of the metal layer overlying the plurality of first regions are elevated by a greater distance from the substrate than second portions of the metal layer overlying the plurality of second regions.

15. The method as recited in claim 14, wherein step A includes fabricating the plurality of first regions to be functionally inactive regions.

16. The method as recited in claim 15, wherein step A further includes fabricating the plurality of second regions to be functionally active elementary cells.

17. The method as recited in claim 16, wherein step A further includes fabricating the semiconductor substrate to be a power MOS substrate.

18. The method as recited in claim 14, wherein step A includes fabricating the plurality of second regions to be functionally active elementary cells.

19. The method as recited in claim 18, wherein step A further includes fabricating the semiconductor substrate to be a power MOS substrate.

20. A method of forming a power MOS device/the method comprising steps of:

A. fabricating a chip comprised of a plurality of first regions and a plurality of second regions, the chip including a semiconductor substrate and a continuous metal layer, the continuous metal layer covering each of the first regions and second regions and electrically interconnecting each of the second regions, the first regions being functionally inactive regions and thicker than the second regions so that the continuous metal layer is elevated above the substrate by a greater amount in the first regions than in the second regions;

B. placing the chip in a device package with the continuous metal layer adjacent a flat conductive washer that contacts the continuous metal layer in the plurality of first regions; and C. sealing the package to establish an electrical connection between the chip and an external electrical terminal.

21. The method as recited in claim 20, wherein step A includes fabricating the plurality of second regions as functionally active elementary cells.

22. The method as recited in claim 21, wherein step A further includes dispersing the plurality of first regions among the plurality of second regions.

23. The method as recited in claim 21, wherein step A further includes fabricating an insulating layer on the semiconductor substrate, a gate layer above the insulating layer, and the continuous metal layer above the gate layer.

24. The method as recited in claim 23, wherein the step of fabricating the insulating layer includes forming the insulating layer to be thicker in the plurality of first regions than in the plurality of second regions.

25. The method as recited in claim 20, wherein step C includes pressing the conductive washer against the continuous metal layer of the chip to create a contact pressure between the conductive washer and the chip that is distributed among only the plurality of first regions.

26. A method of forming a semiconductor device, the method comprising steps of:

A. fabricating a semiconductor chip comprised of a plurality of functionally inactive regions and a plurality of functionally active regions, the chip including a semiconductor substrate and a plurality of layers formed thereon, the plurality of layers including a metal layer, the plurality of layers being formed so that the metal layer is elevated relative to the substrate by a greater amount in the functionally inactive regions than in the functionally active regions;

B. placing the semiconductor chip in a device package with the metal layer adjacent a conductive contact washer;

C. pressing the contact washer against the metal layer in the functionally inactive regions; and D. sealing the package to establish an electrical connection between the semiconductor chip and an external device electrode.

27. The method as recited in claim 26, wherein step C includes distributing a contact pressure that is created between the contact washer and the semiconductor chip among only the plurality of functionally inactive regions.

28. The method as recited in claim 27, wherein step A includes dispersing the plurality of functionally inactive regions among the plurality of functionally active regions.

29. The method as recited in claim 28, wherein the step of dispersing includes arranging the plurality of functionally active regions in a plurality of groups and arranging the plurality of functionally inactive regions in a grid separating the groups of functionally active regions.

30. The method as recited in claim 26, wherein step A includes fabricating an insulating layer between the substrate and the metal layer, wherein the insulating layer in the functionally inactive regions is thicker than the insulating layer in the functionally active regions.

31. The method as recited in claim 30, wherein step A further includes fabricating a gate layer between the insulating layer and the metal layer.

32. The method as recited in claim 31, wherein step A further includes fabricating the semiconductor chip as a power MOS chip.

33. The method as recited in claim 26, wherein step A includes fabricating the metal layer as a continuous metal layer.

* * * * *